(12) United States Patent
Chen

(10) Patent No.: US 7,436,670 B2
(45) Date of Patent: Oct. 14, 2008

(54) HEAT SINK RETAINING DEVICE

(75) Inventor: Win-Haw Chen, Taipei (TW)

(73) Assignee: Inventec Corporation, Taipei (TW)

( * ) Notice: Subject to any disclaimer, the term of this patent is extended or adjusted under 35 U.S.C. 154(b) by 84 days.

(21) Appl. No.: 11/580,053

(22) Filed: Oct. 13, 2006

(65) Prior Publication Data

US 2008/0089030 A1    Apr. 17, 2008

(51) Int. Cl.
*H05K 7/20* (2006.01)
(52) U.S. Cl. .................. 361/704; 361/709; 361/719; 257/718; 257/727; 165/80.3
(58) Field of Classification Search .............. None
See application file for complete search history.

(56) References Cited

U.S. PATENT DOCUMENTS

| | | | |
|---|---|---|---|
| 5,436,798 A * | 7/1995 | Wieland, Jr. | 361/710 |
| 5,542,468 A * | 8/1996 | Lin | 165/80.3 |
| 6,396,695 B1 * | 5/2002 | Lee et al. | 361/704 |
| 6,449,152 B1 * | 9/2002 | Lin | 361/697 |
| 6,477,049 B1 * | 11/2002 | Lin | 361/704 |
| 6,522,545 B2 * | 2/2003 | Shia et al. | 361/704 |
| 6,646,880 B1 * | 11/2003 | Liu | 361/719 |
| 6,731,504 B1 * | 5/2004 | Liu | 361/704 |
| 6,826,052 B2 * | 11/2004 | Ma | 361/709 |
| 7,013,537 B2 * | 3/2006 | Lin et al. | 24/457 |
| 7,019,978 B2 * | 3/2006 | Zhou et al. | 361/704 |
| 7,046,516 B2 * | 5/2006 | Lee et al. | 361/704 |
| 7,292,442 B2 * | 11/2007 | Yu et al. | 361/704 |

\* cited by examiner

*Primary Examiner*—Boris L Chervinsky
(74) *Attorney, Agent, or Firm*—Rabin & Berdo, P.C.

(57) ABSTRACT

A heat sink retaining device for attaching a heat sink on a chip unit is provided, which includes a retaining component and a rotating component. The retaining component is locked to the heat sink in a state of pressing by a hook portion thereof, and the rotating component is pivotally disposed on the retaining component and pivotally rotated between a release position and a locking position. When the rotating component is at the locking position, a clamping portion of the rotating component is snapped onto the chip unit and presses the retaining component against the heat sink and the chip unit, thus improving the stability, reliability and fastness of the integral combination and meanwhile achieving the goal of being extremely convenient in assembling or disassembling.

18 Claims, 4 Drawing Sheets

HEAT SINK RETAINING DEVICE

BACKGROUND OF THE INVENTION

1. Field of the Invention

The present invention relates to a retaining device, and more particularly, to a heat sink retaining device for attaching a heat sink on a chip unit.

2. Related Art

The booming development of the software and hardware pushes computers and the peripherals thereof to continuously improve in speed and quality. However, a following problem of the high chip temperature and the heat dissipation measures has become a non-ignorable problem or even a problem urgently calling for an effective solution. Therefore, in order to effectively reduce the operating temperature of the CPU or the chip on the motherboard of a computer, most of the designers dispose a group of heat sinks with preferred heat dissipation effect on the CPU or on the chip. The most common ones are, for example, a heat sink formed by aluminum extruded heat sink fins, or a heat sink comprising heat conducting piping, or a heat sink formed by aluminum extruded heat sink fins together with a fan.

When the above heat sinks are mounted and fixed, the parts such as an elastic clip, a regulating screw rod, or a set screw are commonly used to position the heat sink on surface of the CPU or the chip on the motherboard. However, as for the conventional positioning manner for locking the heat sink, holes must be formed on the surface of the chip for snapping a fastener, or other tools are required when locking with a screw, and spin-locking the screw will easily cause a damage of the heat sink fins. Moreover, the manner of snapping a fastener or an elastic member to a substrate not only has disadvantages concerning poor stability and being easy to be damaged, but also has defects concerning failure on improving the snapping effect as the elastic force is not a directly downward pressing snapping force, the non-uniform force and being difficult in disassembling. In order to solve the above problems, an adhering manner is provided in the conventional art to mount and fix the above heat sink on the CPU or chip, however, a chemical change tends to occur in the adhesive used in the adhering manner on the junction surface, which causes many uncertainties for the fastness of the adhering, the reliability of a long time adhering is low, and the stability of the adhesive for adhering can not be ensured directly, so that all of the above problems are the troubles and defects caused by the conventional heat sink retaining devices.

Therefore, in the conventional heat sink retaining device, if an elastic component is adopted to mount and fix the heat sink on the surface of the CPU or the chip, it has the disadvantage of damaging the heat sink and the stability and being inconvenient in assembling and disassembling, or if the adhering manner is adopted, it has the problems concerning the reliability and fastness. Therefore, how to design a new heat sink retaining device capable of improving the convenience in assembling and disassembling and increasing the reliability and fastness of the combination thereof is the objective of the present invention.

SUMMARY OF THE INVENTION

In view of the problems of the above conventional art, the present invention provides a heat sink retaining device, which is used for settling the conventional problems of being easily damaged and the poor stability, reliability and fastness when an elastic member or adhering manner is adopted to fix and position the heat sink on the chip, and also for overcoming the disadvantages concerning being inconvenient in assembling and disassembling of the conventional heat sink retaining devices.

In order to achieve the above objective, the present invention provides a heat sink retaining device for attaching a heat sink on a chip unit, which comprises a retaining component and a rotating component. The retaining component is locked on the heat sink by a hook portion thereof and presses against the heat sink by a pressing portion, and the above rotating component is pivotally disposed on the retaining component and pivotally rotated between a locking position and a release position. When the rotating component is at the locking position, a clamping portion thereof is snapped onto the chip unit, so as to press the pressing portion against the heat sink and the chip unit, so that the whole is firmly combined.

A reed further extends from the rotating component, and the reed has an elastic force to push the pressing portion towards the heat sink or the chip unit or pivotally rotate the rotating component to the release position.

Furthermore, the above rotating component further comprises an elastic member. When the rotating component is at the locking position, the reed having the elastic force pushes the pressing portion towards the heat sink or the chip unit, and when leaving the locking position, the rotating component is pivotally rotated to the release position by the elastic force of the elastic member or the reed.

By implementing the heat sink retaining device of the present invention, at least the following efficacies can be achieved.

1. In the heat sink retaining device of the present invention, by the manner of pivotally rotating the rotating component to snap onto the chip unit thus making the retaining component press the heat sink against the chip unit, i.e. without an assembling/disassembling tool and forming holes for retaining, the heat sink is easily assembled/disassembled on the chip unit, so as to achieve the goal of being convenient in assembling/disassembling.

2. In the heat sink retaining device of the present invention, by the manner of pivotally rotating the rotating component to snap onto the retaining component by the elastic force provided by a reed thus making the retaining component press the heat sink against the chip unit by a uniformly distributed directly downward pressing force, the stability of the combination thereof is improved.

3. In the heat sink retaining device of the present invention, the rotating component can leave the locking position to the release position by the double elastic force provided by the elastic member or the reed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
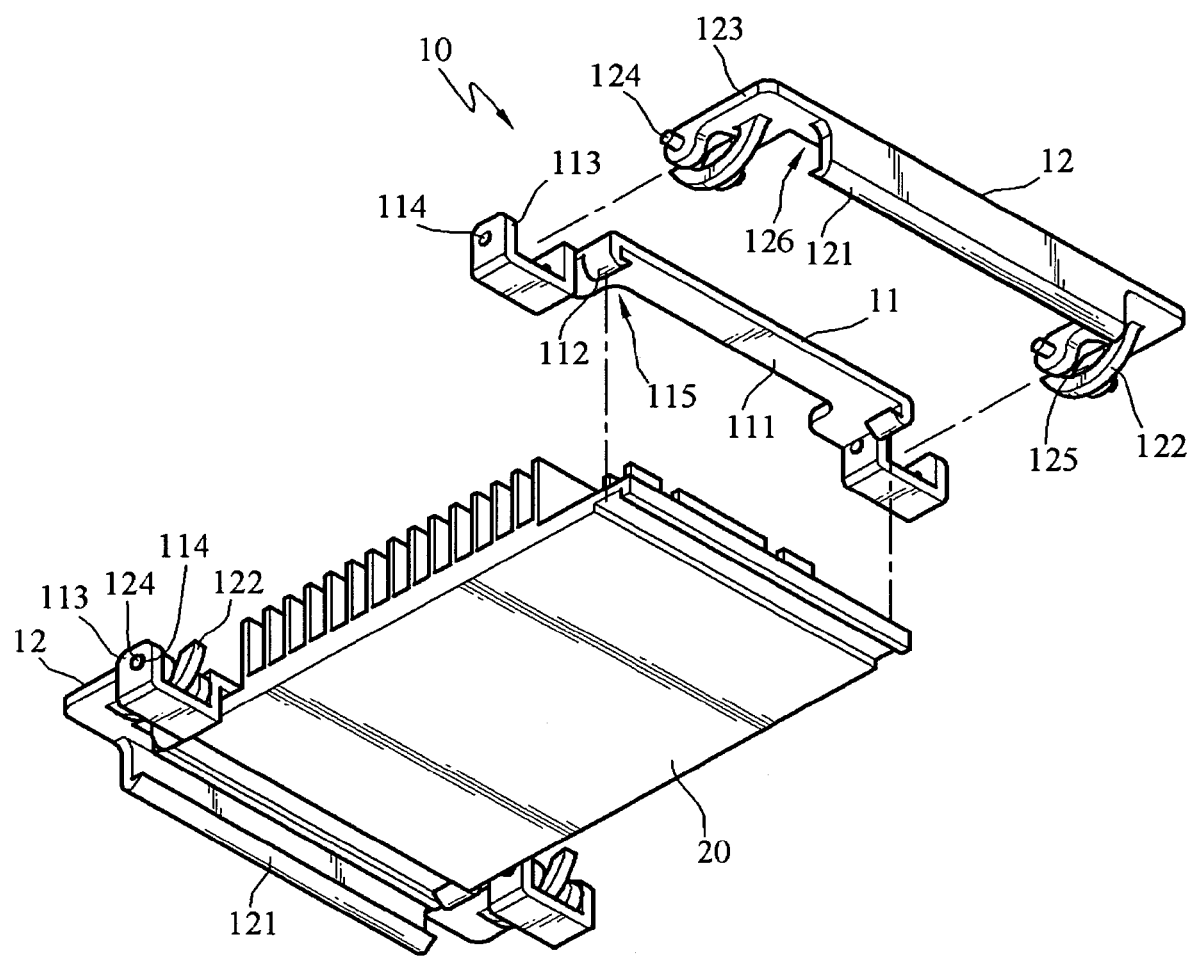
FIG. 1 is a combined schematic view of a heat sink retaining device according to the present invention.
Figure 3:
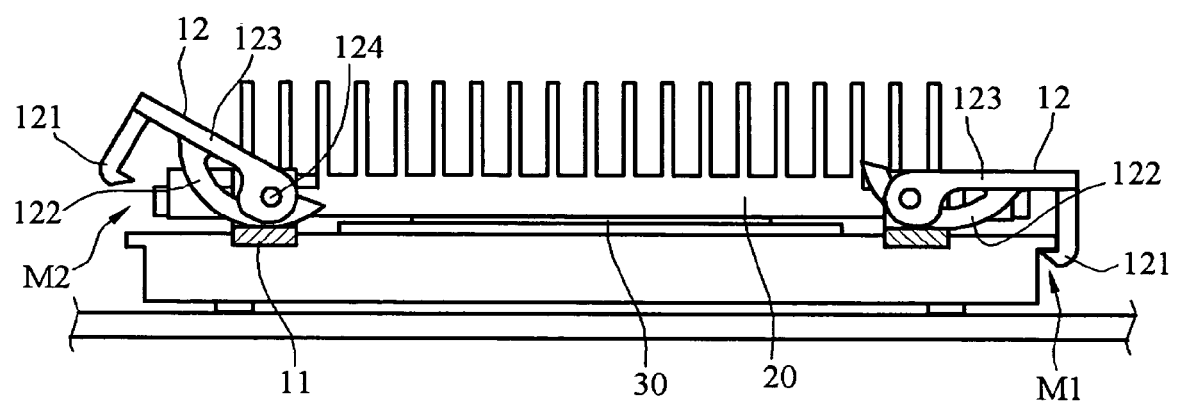
FIG. 3 is a schematic view of a snapping and release state of the heat sink retaining device according to the present invention.

Please refer to FIGS. 1 and 3. FIG. 1 is a combined schematic view of a heat sink retaining device 10 according to the present invention. FIG. 3 is a schematic view of a snapping and release state of the heat sink retaining device 10 according to the present invention. As shown in FIGS. 1 and 3, the heat sink retaining device 10 for attaching a heat sink 20 on a chip unit 30 includes a retaining component 11 and a rotating component 12. The retaining component 11 has a pressing portion 111 for pressing against the heat sink 20 and a hook portion 112 for being locked to the heat sink 20. The rotating component 12 has a clamping portion 121 and is pivotally disposed on the retaining component 11 and pivotally rotated between a locking position M1 and a release position M2. When the rotating component 12 is at the locking position M1, the clamping portion 121 is snapped onto the chip unit 30, so as to press the pressing portion 111 against the heat sink 20 and the chip unit 30.

Figure 2:
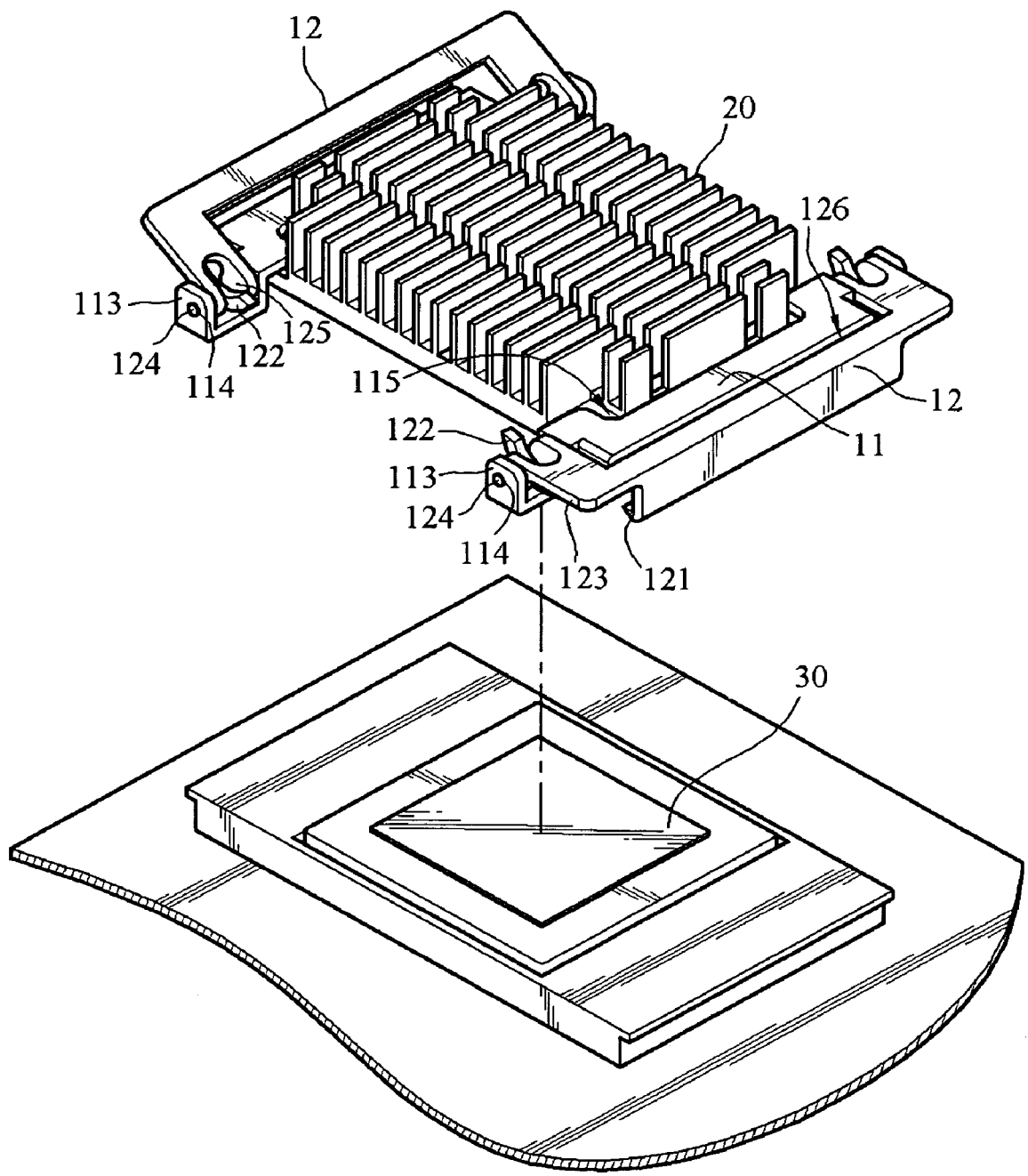
FIG. 2 is a schematic view of the heat sink retaining device combined with a chip unit according to the present invention.

Please refer to FIGS. 1 and 2. FIG. 2 is a schematic view of the heat sink retaining device 10 combined with a chip unit 30 according to the present invention. As shown in FIGS. 1 and 2, two opposite ends of the retaining component 11 have at least one ear portion 113 and two holes 114 respectively located at the ear portion 113. In the preferred embodiment of the present invention, the retaining component 11 has two ear portions 113 being approximately U-shaped, and each of the two ear portions has two holes 114. The rotating component 12 further has a reed 122, and two opposite ends of the rotating component 12 have at least one penetrating portion 123 and a penetrating shaft 124 located on the penetrating portion 123. Furthermore, the rotating component 12 has two penetrating portions 123 respectively including a penetrating shaft 124, and the reed 122 may also extend to the penetrating porting 123 of the rotating component 12. Also, the hook portion 112 of the retaining component 11 is locked to the heat sink 20, and the rotating component 12 is pivotally disposed in the holes 114 of the retaining component 11 by the above penetrating shafts 124, so as to be pivotally rotated between the locking position M1 and the release position M2.

Figure 4:
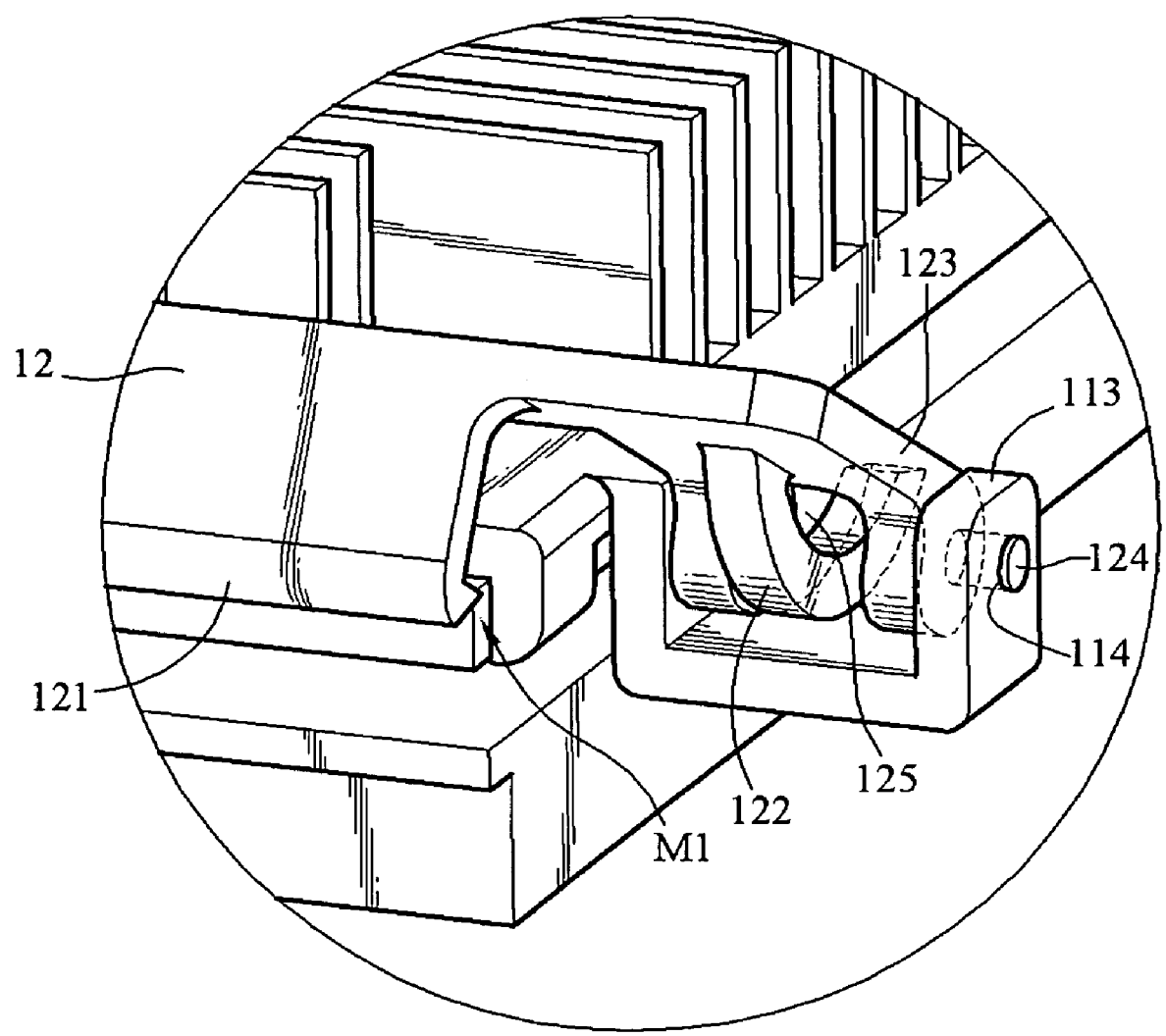
FIG. 4 is a schematic view of the heat sink retaining device clamped on the chip unit according to the present invention.

Please refer to FIGS. 3 and 4. FIG. 4 is a schematic view of the heat sink retaining device 10 clamped on the chip unit 30 according to the present invention. As shown in FIGS. 3 and 4, when the rotating component 12 is at the locking position M1, the clamping portion 121 is snapped onto the above chip unit 30 (the chip unit 30 also can include a chip base for the clamping portion to snap), so that the pressing portion 111 presses against the heat sink 20 and the chip unit 30.

More specifically, when the rotating component 12 is at the locking position M1, the reed 122 has an elastic force to push the pressing portion 111 towards the heat sink 20 or the chip unit 30, and when leaving the locking position M1, the rotating component 12 is pivotally rotated to the release position M2 by the elastic force. Further, an elastic member 125 is clamped between the reed 122 and the penetrating portion 123, likewise, when the rotating component 12 is at the locking position M1, the reed 122 has an elastic force to push the pressing portion 111 towards the heat sink 20 or the chip unit 30, and when leaving the locking position M1, the rotating component 12 is pivotally rotated to the release position M2 by the elastic force of the elastic member 125 or the reed 122. Due to different design shapes of the heat sink 20, the retaining component 11 further has a recessed portion 115 for accommodating the heat sink 20 and matching with the heat sink 20, likewise, the above rotating component 12 also further has a notch portion 126 for accommodating the retaining component 11 and matching with the retaining component 11.

Furthermore, the present invention provides a heat sink retaining device 10 for retaining a heat sink 20 on a chip unit 30, and in the above preferred embodiments of the heat sink retaining device 10, the clamping portion 121 thereof is flake-shaped, the reed 122 is approximately meniscus-shaped and is a plastic member, and the above elastic member 125 is made of a plastic material. Of course, besides the flake shape disclosed in the preferred embodiments, the clamping portion 121 may also be a plurality of clip hooks.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat sink retaining device, for retaining a heat sink on a chip unit, comprising:
   a retaining component, having a pressing portion and a hook portion, the retaining component pressing the heat sink by the pressing portion and being locked to the heat sink by the hook portion, wherein two opposite ends of the retaining component have at least one ear portion and two holes respectively located at the ear portion; and
   a rotating component, having a clamping portion and being pivotally disposed on the retaining component and pivotally rotated between a locking position and a release position, wherein when the rotating component is at the locking position, the clamping portion is snapped onto the chip unit, so that the pressing portion firmly presses the heat sink and the chip unit, wherein two opposite ends of the rotating component have at least one penetrating portion and a penetrating shaft located in the penetrating portion for penetrating the holes, so that the rotating component is pivotally disposed and snapped onto the retaining component.

2. The heat sink retaining device as claimed in claim 1, wherein the ear portion is approximately U-shaped.

3. The heat sink retaining device as claimed in claim 1, wherein an elastic member is clamped between the reed and the penetrating portion, when the rotating component is at the locking position, the reed has an elastic force to push the pressing portion towards the heat sink or the chip unit, and when leaving the locking position, the rotating component is pivotally rotated to the release position by the elastic force of the elastic member or the reed.

4. The heat sink retaining device as claimed in claim 3, wherein the elastic member is made of a plastic material.

5. The heat sink retaining device as claimed in claim 1, wherein the clamping portion is flake-shaped.

6. The heat sink retaining device as claimed in claim 1, wherein the clamping portion is a plurality of clip hooks.

7. The heat sink retaining device as claimed in claim 1, wherein the retaining component further has a recessed portion for accommodating the heat sink and matching with the heat sink.

8. The heat sink retaining device as claimed in claim 1, wherein the rotating component further has a notch portion for accommodating the retaining component and matching with the retaining component.

9. The heat sink retaining device as claimed in claim 1, wherein a reed extends from the rotating component, when the rotating component is at the locking position, the reed has an elastic force to push the pressing portion towards the heat sink or the chip unit, and when leaving the locking position, the rotating component is pivotally rotated to the release position by the elastic force.

10. The heat sink retaining device as claimed in claim 9, wherein the reed is approximately meniscus-shaped.

11. The heat sink retaining device as claimed in claim 9, wherein the reed is a plastic member.

12. The heat sink retaining device as claimed in claim 9, wherein the reed extends to the penetrating portion of the rotating component.

13. The heat sink retaining device as claimed in claim 9, wherein an elastic member is clamped between the reed and the penetrating portion, when the rotating component is at the locking position, the reed has an elastic force to push the pressing portion towards the heat sink or the chip unit, and when leaving the locking position, the rotating component is pivotally rotated to the release position by the elastic force of the elastic member or the reed.

14. The heat sink retaining device as claimed in claim 13, wherein the elastic member is made of a plastic material.

15. A heat sink retaining device, for retaining a heat sink on a chip unit, comprising:
   a retaining component, having a pressing portion and a hook portion, wherein the retaining component pressing presses the heat sink by the pressing portion and being locked to the heat sink by the hook portion;
   a rotating component, having a clamping portion and being pivotally disposed on the retaining component and pivotally rotated between a locking position and a release position, wherein when the rotating component is at the locking position, the clamping portion is snapped onto the chip unit, so that the pressing portion firmly presses the heat sink and the chip unit; and
   a reed, extending from the rotating component, wherein when the rotating component is at the locking position, the reed has an elastic force to push the pressing portion towards the heat sink or the chip unit, and when leaving the locking position, the rotating component is pivotally rotated to the release position by the elastic force.

16. The heat sink retaining device as claimed in claim 15, wherein the reed is approximately meniscus-shaped.

17. The heat sink retaining device as claimed in claim 15, wherein the reed is a plastic member.

18. The heat sink retaining device as claimed in claim 15, wherein the reed extends to the penetrating portion of the rotating component.

* * * * *